United States Patent [19]

Block

[11] 4,071,838
[45] Jan. 31, 1978

[54] SOLID STATE FORCE TRANSDUCER AND METHOD OF MAKING SAME

[75] Inventor: Barry Block, Los Altos Hills, Calif.

[73] Assignee: Diax Corporation, Los Altos Hills, Calif.

[21] Appl. No.: 656,632

[22] Filed: Feb. 9, 1976

[51] Int. Cl.² .......................................... H01L 10/10
[52] U.S. Cl. .................... 338/47; 29/610 SG; 29/592 R; 73/517 R; 156/647; 338/5; 338/42
[58] Field of Search ..................... 338/2, 4, 5, 42, 36, 338/47; 357/26; 73/88.5 SD, 398 AR, 517, 518; 29/580, 592, 610 SG; 156/17

[56] References Cited

U.S. PATENT DOCUMENTS

| | | | |
|---|---|---|---|
| 3,757,414 | 9/1973 | Keller | 357/26 X |
| 3,924,322 | 12/1975 | Kurtz et al. | 29/580 |
| 3,968,466 | 7/1976 | Nakamura et al. | 338/42 |

*Primary Examiner*—C. L. Albritton

[57] ABSTRACT

Solid state folded leaf spring force transducers are fabricated by batch photolithographic and etching techniques from a monocrystalline material, such as silicon. The folded leaf spring structure includes elongated gaps separating adjacent leaf spring leg portions, such elongated gaps being oriented parallel to a crystallographic axis of the monocrystalline material. In a preferred embodiment the monocrystalline material is of diamond cubic type and the leaf spring gaps extend in mutually orthogonal directions parallel to the $<01\bar{1}>$ and $<0\bar{1}\bar{1}>$ crystallographic axes, respectively. In a preferred method of fabricating the spring structure, the structure is etched from a monocrystalline wafer by means of an anisotropic etchant so as to more precisely define angles and dimensions of the resultant spring structure. In one embodiment, the gaps between adjacent leg portions of the spring structure are sealed in a fluid tight manner by means of oxide membranes left intact upon etching of the spring structure. In an accelerometer embodiment, sensing masses of equal weight are affixed to opposite sides of the spring structure for dynamically balancing same.

37 Claims, 18 Drawing Figures

Fig_1
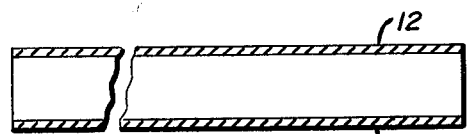
Fig_2
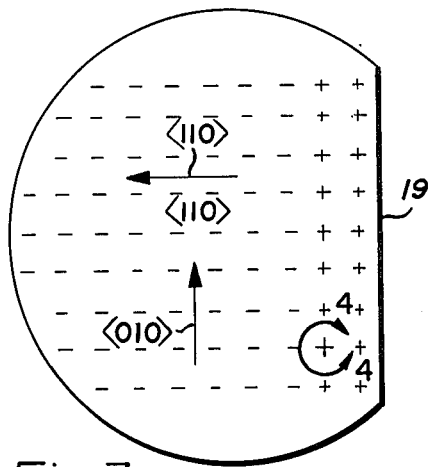
Fig_3
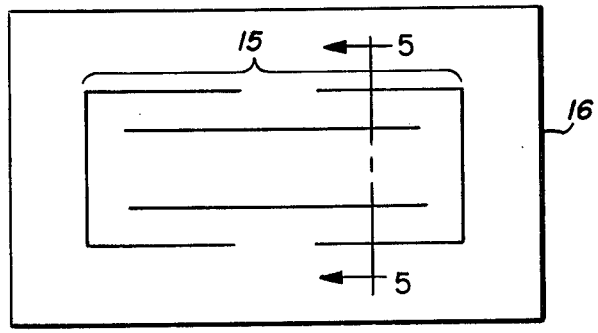
Fig_4
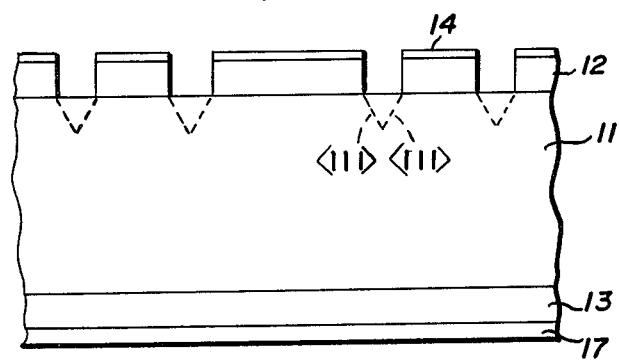
Fig_5
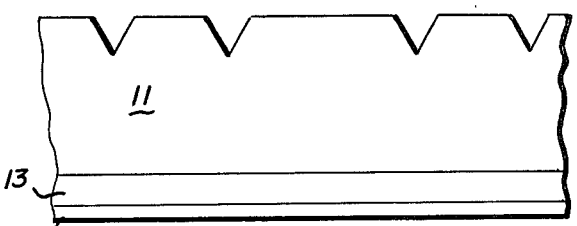
Fig_6
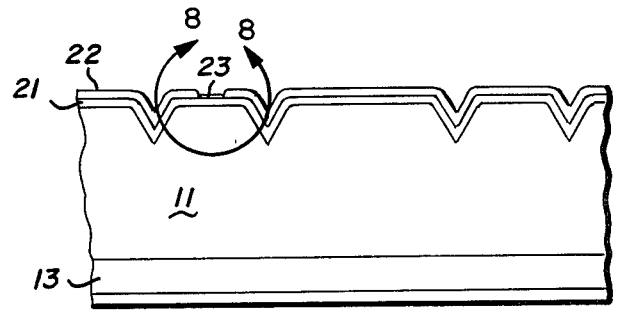
Fig_7
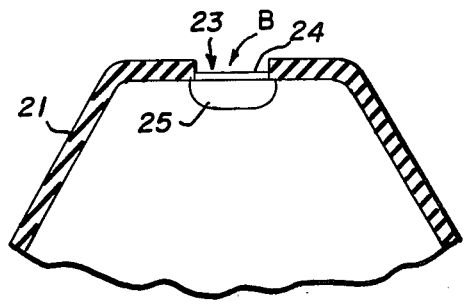
Fig_8
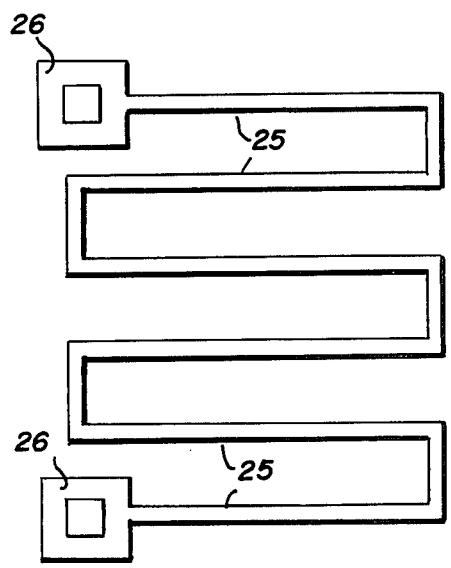
Fig_9

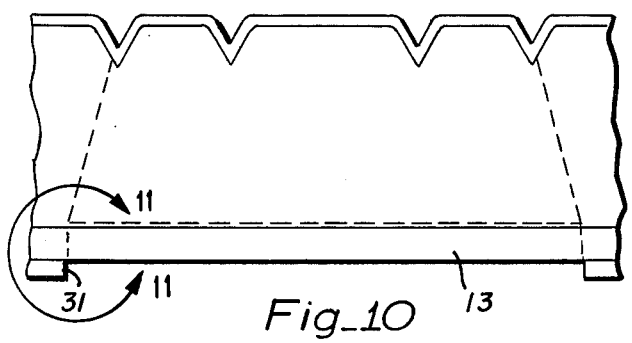
Fig_10
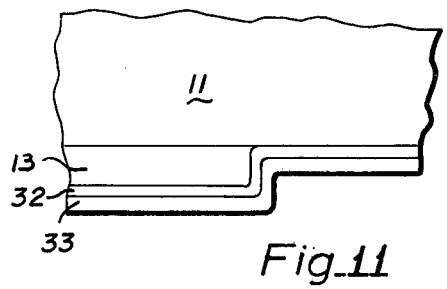
Fig_11
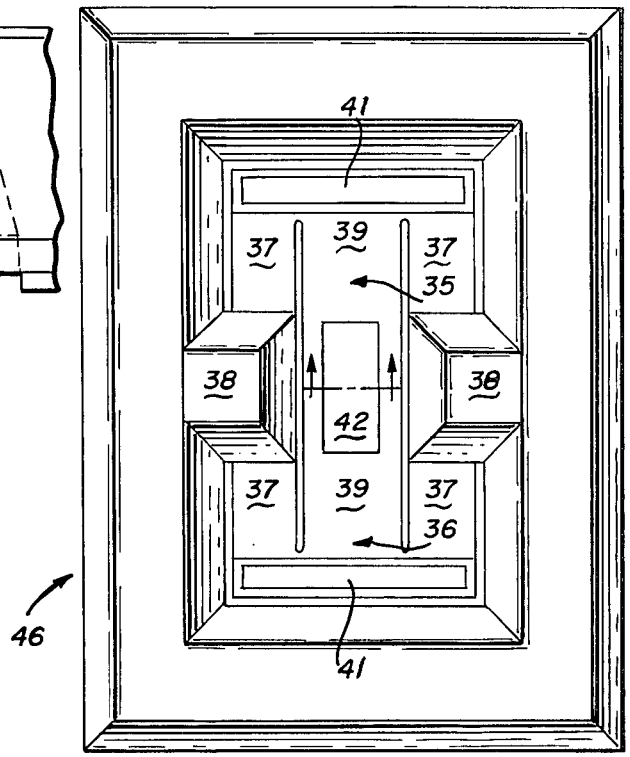
Fig_13
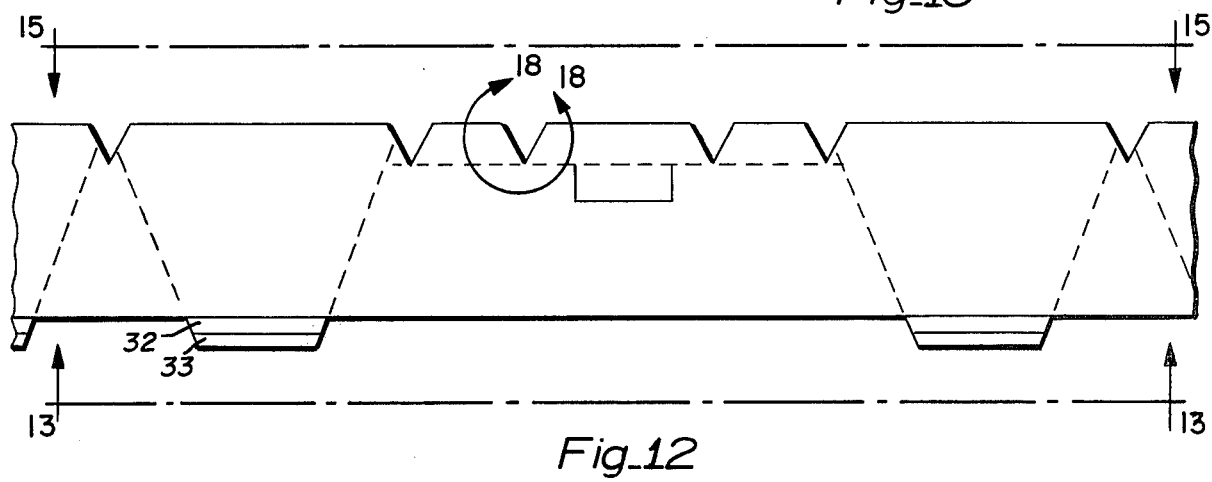
Fig_12
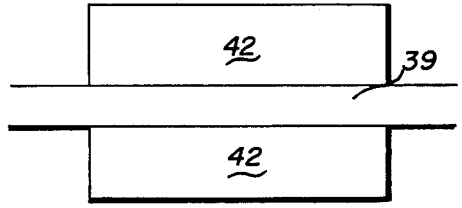
Fig_14
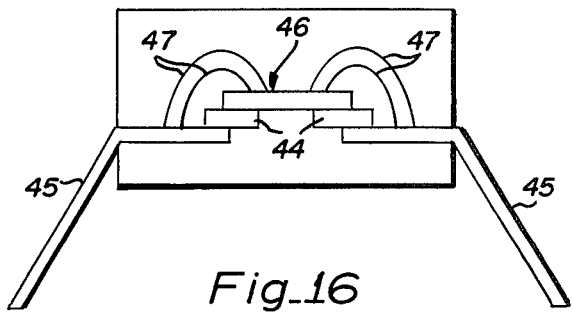
Fig_16

SOLID STATE FORCE TRANSDUCER AND METHOD OF MAKING SAME

RELATED CASES

A force transducer employing a plurality of E-shaped folded cantilever leaf spring portions angularly displaced with respect to each other about an axis of sensitivity is disclosed and claimed in my copending U.S. application Ser. No. 586,892 filed June 16, 1975 and assigned to the same assignee as the present invention. In addition, the use of a compliant membrane for sealing the spring structure in a fluid tight manner is disclosed and claimed in copending U.S. application Ser. No. 599,768 filed July 28, 1975, now issued as U.S. Pat. No. 4,021,766 on May 3, 1977. Furthermore, a solid state force transducer with an integral support structure is disclosed and claimed in copending application U.S. Ser. No. 656,636 filed Feb. 9, 1976.

BACKGROUND OF THE PRESENT INVENTION

The present invention relates in general to solid state force transducers and more particularly to an improved force transducer and method of making same wherein a folded leaf spring force transducer structure is formed of a monocrystalline material.

DESCRIPTION OF THE PRIOR ART

Heretofore, monocrystalline force transducers have been fabricated in batches by etching thin diaphragms out of a monocrystalline silicon wafer. Piezoresistive sensing elements were deposited on the surface of the diaphragm near the outer periphery thereof. One of the piezoresistive elements was oriented so as to detect the radial component of stress in the diaphragm and the second piezoresistive element was oriented to sense circumferential elements of stress in the thin membrane or diaphragm when the diaphragm was subjected to a force, such as that exerted by means of a fluid pressure differential across the diaphragm. Such force transducers are disclosed in U.S. Pat. No. 3,417,361 issued Dec. 17, 1968 and in U.S. Pat. No. 3,757,414 issued Sept. 11, 1973. In addition, this type of transducer is disclosed in an article titled "Solid State Digital Pressure Transducer" appearing in the *IEEE Transactions on Electron Devices,* Vol. ED-16, No. 10, October 1969, pages 870-876.

One of the problems encountered in these prior art diaphragm type transducers is that the strain sensors are located near the outer periphery of the membrane where the maximum strain is the radial strain and where the tangential strain is near zero. However, location of the sensing elements near the outer periphery of the diaphragm, particularly in the case where the periphery of the diaphragm is supported from a rectangular support structure, introduces some undesired edge effects resulting in a slight degree of nonlinearity of the force transducer.

It has also been proposed to construct an accelerometer by affixing a monocrystalline silicon beam to a support structure so as to achieve a cantilever spring. A piezoresistive strain sensing element was deposited on the surface of the silicon beam for sensing the stress produced as a result of a force exerted on the beam, such as by acceleration. Such an accelerometer is disclosed in an article titled "A Silicon Integrated Circuit Force Sensor" appearing in the IEEE *Transactions on Electron Devices,* Vol. ED-16, No. 10, October 1969, pages 867-870. See also *IBM Technical Disclosure Bulletin* titled "Force Transducer" appearing in Vol. 7, No. 12 of May 1966 at pages 1225-1226.

A problem with this cantilever structure is that the spring structure has both rectilinear and a curvilinear displacement in response to the applied force so that the detected strain is not a linear function of the applied force.

It is also known from the prior art to construct an accelerometer from a plurality of E-shaped spring structures so as to achieve rectilinear motion of the sensing mass in response to a component of force applied to the spring structure along the sensing axis. Such an accelerometer or force transducer is disclosed in U.S. Pat. No. 2,702,186 issued Feb. 15, 1955.

Furthermore, it is known from the prior art to provide a linear spring suspension structure for deriving rectilinear translation of a device suspended from the structure. The suspension system employs a plurality of E-spring structures coupled to the displaceable device in a common plane and in mutually opposed relation, i.e., disposed on opposite sides of the displacement axis. Such a structure is disclosed in U.S. Pat. No. 3,295,803 issued Jan. 3, 1967.

The problem with these prior art E-spring structures is that they are relatively large, employing a number of elements which are joined together via screws, or other fixing means with the result that they are relatively costly of manufacture and in addition exhibit undesired hysteresis effects.

SUMMARY OF THE PRESENT INVENTION

The principal object of the present invention is the provision of an improved force transducer and more particularly to such a transducer employing a folded leaf spring which is advantageously fabricated employing photolithographic techniques as developed in the semiconductor industry, whereby the manufacturing cost and size are substantially reduced and in some instances the performance substantially improved over the prior art.

In one feature of the present invention, a folded leaf spring transducer is formed of a monocrystalline material, whereby the resultant spring structure has improved linearity and reduced hysteresis.

In another feature of the present invention, a batch of folded leaf spring force transducers are fabricated from a monocrystalline wafer of nonmetallic material employing photolithographic and etching steps.

In another feature of the present invention, the folded leaf spring force transducer includes first and second adjacent leg portions separated by means of an elongated gap, such gap being oriented parallel to a certain predetermined crystallographic axis of a monocrystalline material from which the spring structure is fabricated.

In another feature of the present invention, an anisotropic etchant is employed for etching a folded leaf spring transducer structure having elongated gaps formed between adjacent leg portions of the structure, such gaps being oriented parallel to certain predetermined crystallographic axes of the monocrystalline material.

In another feature of the present invention, a folded leaf spring force transducer structure is etched from a wafer in such a way as to leave an unetched base support structure connected to the leaf spring structure in supportive engagement therewith.

In another feature of the present invention, a sensing mass structure is coupled to the folded leaf spring structure with approximately equal mass on opposite sides of the plane of the folded leaf structure.

In another feature of the present invention, the folded leaf spring sensor structure is formed with a thin compliant membrane material bridging the gap between adjacent leg portions of the spring so as to provide a fluid tight seal for the spring structure.

Other features and advantages of the present invention will become apparent upon a perusal of the following specification taken in connection with the accompanying drawings wherein:

BRIEF DESCRIPTION OF THE DRAWINGS

FIG. 1 is a longitudinally foreshortened transverse sectional view of a wafer of monocrystalline material employed in the process of the present invention, FIG. 2 is a view similar to that of FIG. 1 depicting an oxide layer formed on opposite sides of the wafer, FIG. 3 is a plan view of the wafer of FIG. 2 showing a pattern of folded leaf spring structures formed in a photoresist coating over the surface of the wafer, FIG. 4 is an enlarged detail view of a leaf spring pattern delineated by line 4—4 of FIG. 3, FIG. 5 is an enlarged sectional view of a portion of the structure of FIG. 4 taken along line 5—5 in the direction of the arrows, FIG. 6 is a view similar to that of FIG. 5 showing a subsequent step in the process for fabrication of the spring structure of the present invention, FIG. 7 is a view similar to that of FIG. 6 showing a subsequent step in the process, FIG. 8 is an enlarged sectional view of a portion of the structure of FIG. 7 delineated by line 8—8 and depicting a subsequent step in the process wherein piezoresistors are formed in the surface of the spring structure, FIG. 9 is an enlarged detail view of a piezoresistor formed in the surface of the spring structure, FIG. 10 is a view similar to that of FIG. 7 depicting a subsequent step in the process, FIG. 11 is an enlarged sectional view of a portion of the structure of FIG. 10 delineated by line 11—11 and depicting a subsequent step in the process, FIG. 12 is an enlarged view similar to that of FIG. 10 depicting etching of a recess in the wafer from the back side to define the spring structures therein, FIG. 13 is a bottom view of the etched structure of FIG. 12 taken along line 13—13, FIG. 14 is an enlarged sectional view of a portion of the structure of FIG. 13 taken along line 14—14, FIG. 16 is a schematic sectional view of a dual in-line integrated circuit package having the force transducer of the present invention mounted therein.

DESCRIPTION OF THE PREFERRED EMBODIMENTS

Figure 15:
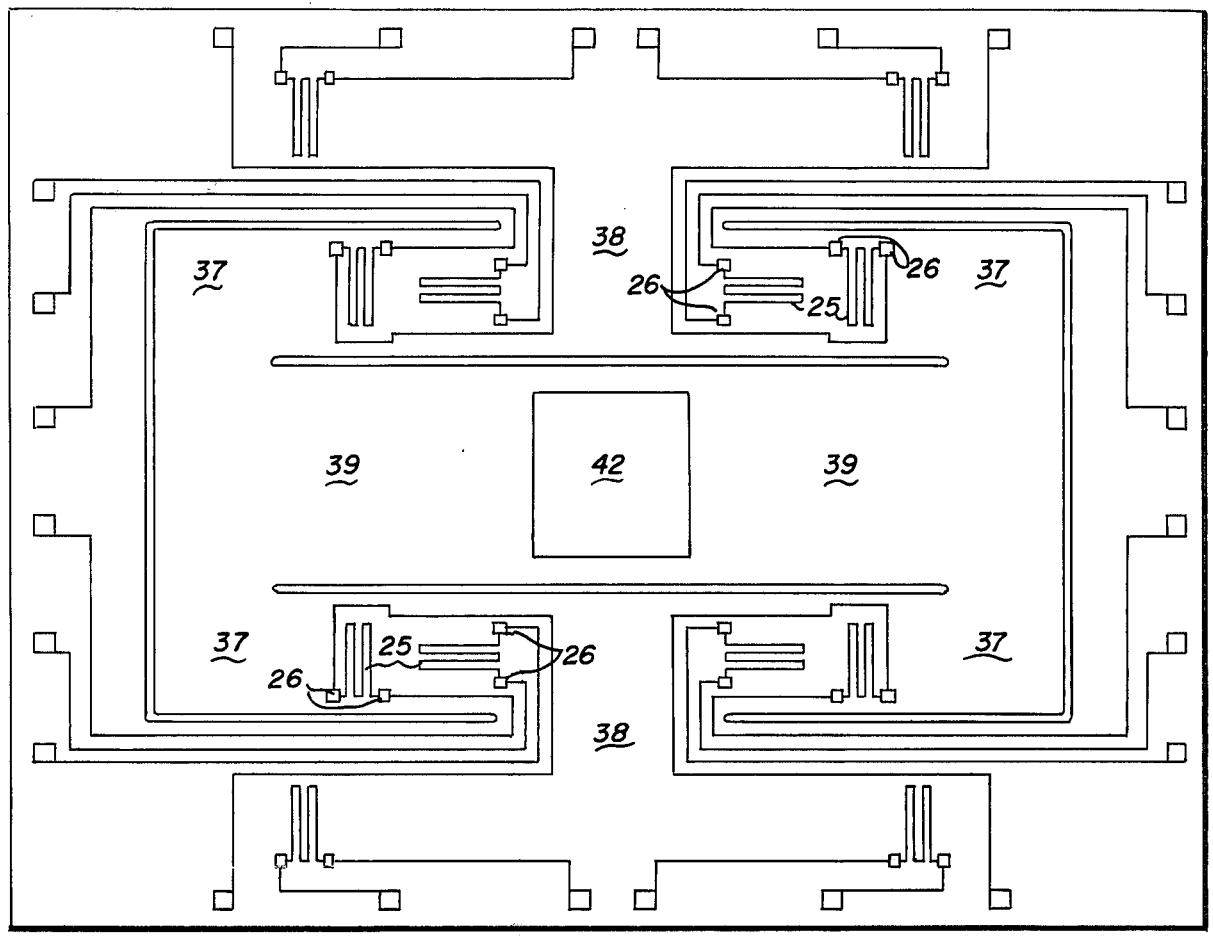
FIG. 15 is a top view of the structure of FIG. 12 taken along line 15—15 in the direction of the arrows.

Referring now to FIG. 1 there is shown a typical wafer 11 from which a batch of force transducers are to be fabricated according to the process of the present invention. In a typical example, the wafer 11 is made of a nonmetallic monocrystalline material such as silicon, germanium, quartz, gallium arsenide, gallium phosphide, etc. In a preferred embodiment, the wafer 11 is made of a diamond cubic material, such as silicon and the wafer 11 has a thickness of 10 mils or 254 ± 2 microns and a convenient diameter, such as 3 to 5 inches. In the case of diamond cubic material, the crystallographic plane is preferably formed at the upper and lower major surfaces of the wafer 11. Furthermore, the wafer 11, in the case of silicon, is preferably doped with an N type dopant such as phosphorus to a resistivity of 6 to 8 ohm centimeters. In the second step of the process, the wafer 11 is oxidized on opposite sides to form oxidized layers 12 and 13, as of 8000 angstroms in thickness. This is conveniently achieved by putting the wafers in a furnace at 1150° C in the presence of oxygen.

In the next step of the process, the oxide layers 12 and 13 are coated on the top side with a photoresist material and on the bottom side with a protective coating, as of krylon. The photoresist coating is exposed by a conventional photolithographic process to an array of transducer patterns, such as the double E-shaped folded cantilever spring pattern 15 of FIG. 4. Furthermore, each of the individual patterns 15 is separated from the adjacent ones by means of rectangular boundary pattern portion or frame 16. After exposure of the photoresist coating 14, it is developed and then etched out to expose the oxide layer 12. The oxide layer is then etched through the slot pattern 15 formed by the photoresist coating by means of a buffered hydrofluoric acid etchant to define the spring patterns 15 and frame patterns 16 in the oxide coating, thereby exposing the silicon wafer through those patterns.

Next, the silicon wafer 11 is etched with an anisotropic etchant such as 25% by weight of sodium hydroxide in water. The spring and frame patterns 15 and 16 were aligned to the $<110>$ crystallographic plane of the wafer, as shown in FIG. 3, with the lines of the patterns which are to form spring defining gaps or cuts in the wafer structure, oriented parallel to either the $<01\bar{1}>$ crystallographic axis or the $<0\bar{1}1>$ crystallographic axis. The proper orientation relative to the wafer 11 is determined by a chord 19 sliced from each wafer, such chord 19 running perpendicular to either the $<01\bar{1}>$ or the $<0\bar{1}1>$ crystallographic axis.

The anisotropic etchant etches preferentially along the $<111>$, $<1\bar{1}1>$, $<\bar{1}\bar{1}1>$ and $<11\bar{1}>$ planes, thus precisely defining the gaps or grooves in the surface of the wafer 11 which are to subsequently define the spring structure of the force transducer. In a typical example of an accelerometer, the anisotropic etch is continued to a depth of approximately 25 microns in the upper surface of the monocrystalline wafer 11. In the anisotropic etching step, the krylon protective coating 17 is also etched from the oxide layer 13 on the bottom of the wafer. In the next step, as shown in FIG. 6, the krylon coating 17 is reestablished on the bottom and then the oxide layer 12 is stripped from the upper surface of the wafer 11 by means of etching in dilute hydrofluoric acid. Next, the krylon coating 17 is stripped from the bottom surface by means of a conventional stripper such as phenol.

In the next step as shown in FIG. 7, the upper surface of the wafer 11 is reoxidized to form layer 21 to a thickness of approximately 1600 angstroms. The oxide layer 21 is then coated with photoresist material and exposed via conventional photolithographic exposure techniques to a pattern of radiation corresponding to a plurality of piezoresistors to be formed in the surface of the resultant spring structure or pattern 15. Typically, the piezoresistors are generally of the pattern shown in FIG. 9.

One set of the piezoresistors are oriented with the longitudinal axes of the piezoresistors extending longitudinally of the spring leg portions of the spring structure in a region thereof of maximum stress, such as near the point of support of one of the inner ends of the outer leg portions. A second set of piezoresistors is also formed in that region with their longitudinal axes aligned perpendicular to the longitudinal axis of the particular leg of the spring so as not to pick up a change in piezoresistance due to stress of the spring structure caused by displacement thereof in response to a force applied to the spring along its axis of sensitivity, ji.e., into the paper in FIG. 4.

These two orientations of piezoresistors are utilized in an electrical bridge circuit so that the difference between the piezoresistance yields a measure of the stress in the spring structure and thus a measure of its displacement in response to a force applied thereto to be measured.

Next, the photoresist layer 22 is developed to expose the oxide layer 21 in accordance with the pattern of the piezoresistors to be formed. Next, the back surface of the wafer is coated with krylon, the photoresist is removed in the exposed piezoresistor pattern to expose the underlying oxide layer 21 in accordance with the developed patterns 23. Then the oxide layer 21 is etched through with dilute hydrofluoric acid to expose the underlying monocrystalline silicon wafer 11. Then the wafer is stripped of the krylon and the remaining photoresist.

Next, as shown in FIG. 8, boron is diffused into the silicon wafer 11 through the openings 23 in the oxide layer 21. The boron diffusion is obtained by contacting the surface of the silicon wafer 11 with a boron nitride wafer causing the boron nitride wafer to dissociate and the freed boron to diffuse into the wafer to form the piezoresistor, such piezoresistors having a resistivity of 300 ohms per square. Next, the piezoresistor layer 25 is covered over by regrowing a thin layer of oxide 24 over the piezoresistors, such oxide being obtained by exposing the wafer 11 at elevated temperature to a carrier gas of oxygen and nitrogen.

Next, the wafer 11 is coated on the top surface with a photoresist material and exposed to a pattern of radiation corresponding to contact apertures to be made to the opposite ends of each of the piezoresistors 25, as shown at 26 in FIG. 9. The photoresist material is then developed and removed in the regions through which contact is to be made. Next, the thin layer 24 of oxide is etched by dilute hydrofluoric acid to expose the piezoresistors 25 at the contact regions 26. During the etch step, the back surface of the wafer is protected by a coating of krylon. Next, the photoresist material is stripped and aluminum is evaporated to a thickness of approximately one micron over the front surface of the oxide coated wafer, such aluminum making contact to the piezoresistors 25 through the contact openings 26. Then, a photoresist coating is applied over the aluminum and exposed to a pattern of radiation corresponding to the intraconnect lead pattern to be formed on the wafer. The photoresist material is then developed to expose the aluminum in the desired regions and then the aluminum is etched with phosphoric acid. Next the wafer is placed into an oven at 500° C to alloy the aluminum contacts into the piezoresistor regions 25.

Referring now to FIG. 10, next, the bottom side of the wafer 11 is coated with a photoresist material 31 and exposed to a pattern of radiation corresponding to a base support structure which is to surround each of the spring structures. The base support structure is shown in FIG. 13. The photoresist material 31 is then developed and removed in the regions which are to be etched. The top side of the wafer 11 is then coated with krylon and the oxide layer 13 on the bottom side is etched through by means of dilute hydrofluoric acid to define the base structure.

Next, as shown in FIG. 11, the bottom surface of the wafer 11 is coated with a first layer of chromium 32 to a thickness of approximately 500 angstroms followed by a layer of gold 33 to approximately 8000 angstroms in thickness. Next, the metallized layers are coated with a photoresist, exposed to patterns of radiation corresponding to the base structure. The front side of the wafer 11 is protected by krylon and then the back side is etched with an etchant for the gold and chromium layers.

Next the wafer, as shown in FIG. 12, is exposed to an anisotropic etchant for the silicon, such etching producing a recess in the back side of the wafer which extends inwardly to an intersection with the spring defining pattern of recesses in the front surface of the wafer, to define the spring structure and its base support as shown in FIG. 13. More particularly, the resultant spring structure includes a pair of mutually opposed E-shaped springs 35 and 36 each having a pair of outer leg portions 37 supported at their inner ends from inwardly directed portions of the base support 38. The outer legs 37 are interconnected at their outer ends to the outer end of a central leaf spring portion 39.

In a preferred embodiment, two transverse strengthening members 41 are formed at the outer ends of each of the E-shaped spring portions 35 and 36 by stopping the etching at an intermediate point in the formation of the back recess, coating the strips 41 and 42 with a suitable protective material such as cr and gold and then continuing the etch.

A sensing mass 42 is affixed to both the top and bottom surfaces of the central leg portions 39 of the E-shaped leaf springs 35 and 36, as shown in FIG. 14 and in FIG. 13, to facilitate rendering the composite spring structure responsive to acceleration. In a typical example, the masses 42 comprise two 10 milligram squares of gold affixed as by glue to the inner ends of the central leg portions 39 of the E-springs 35 and 36.

When the etching is complete the individual accelerometer or force transducers are individually etched out of the wafer. The wax is then removed from the front surface of the transducers and they are mounted in a conventional dual in-line integrated circuit package as shown in FIG. 16.

More particularly, a base plate 44 is affixed to the upper surface of the inner ends of the lead frames 45. The transducer 46 is die attached to the upper surface of the mounting plate 44 as by conventional die attach techniques utilizing the gold and chromium coating on the bottom surface of the base support structure of the individual force transducer 46. Wire bonding leads 47 are then wire bonded between the individual conductors of the lead frame structure 45 and the respective connecting pads on the front surface of the transducer 46. The front surface of the transducer 46 is shown in greater detail in FIG. 15.

In a typical example, the resultant transducer 46 has a spring thickness of approximately 25 microns, a length of approximately 200 mils and a width of 150 mils and is approximately 10 mils thick in the region of the surrounding base support structure.

Figure 17:
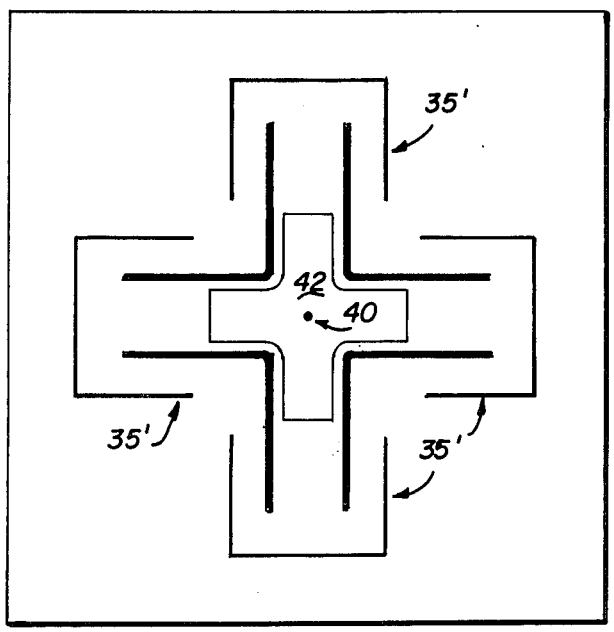
FIG. 17 is a plan view similar to that of FIG. 15 showing an alternative spring structure of the present invention.

Referring now to FIG. 17, there is shown an alternative spring pattern consisting of four E-springs 35 located at 90° angles about the central axis of sensitivity 40, which is perpendicular to the paper. The spring structure of FIG. 17 is very rigid in response to forces applied normal to the axis of sensitivity. Thus, there is relatively little cross coupling of forces out of the axis of sensitivity into deflection of the structure along the axis of sensitivity.

Figure 18:
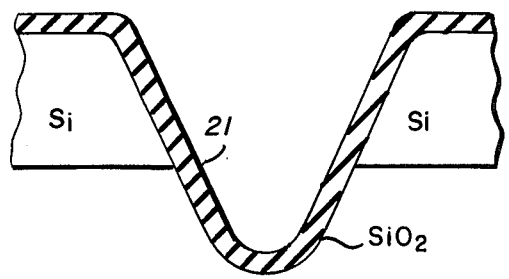
FIG. 18 is an enlarged sectional view of a portion of the structure of FIG. 12 delineated by line 18—18 and depicting a compliant sealing membrane formed between adjacent leg portions of the spring structure.

Referring now to FIG. 18 there is shown a structure for sealing the spring structure in a fluid tight manner while permitting deflection of the spring structure. More particularly, the silicon dioxide coating 21, which was formed on the top surface of the wafer during the step depicted in FIG. 7, is protected, in the region of the slots, through the various processing steps. In the last etching step, as depicted in FIG. 12 the anisotropic etchant does not attack the silicon dioxide, thereby leaving a thin silicon dioxide web interconnecting adjacent leaf spring portions and bridging the gap therebetween. The silicon dioxide web would ordinarily be permeable to water vapor and thus is coated with a suitable sealant such as a layer of tantalum or gold, or parylene.

The advantages of the present invention include the batch fabrication of transducers of the folded spring type which exhibit improved linearity as contrasted with the prior art diaphragm and cantilever force transducers. An accelerometer of the configuration of FIGS. 13 and 15 has yielded an output signal of 20 volts peak-to-peak when tilted through an angle of 360° relative to the earth's gravitational field. The measured peak-to-peak deviation of the output signal from G sin θ, where θ is the angle of tile relative to the gravitational horizontal and G is the earth's gravitational force, was only 0.1 percent of the peak-to-peak full scale output.

As used herein, monocrystalline is defined to include an epitaxial layer grown upon a monocrystalline substrate even though the expitaxial layer may not comprise only a single crystal.

What is claimed is:

1. In a method for fabricating a solid state force transducer of the type including a leaf spring structure having a plurality of leg portions angularly separated about an axis of maximum compliance and supported so that said leg portions of the leaf spring structure are physically displaced relative to the support structure in response to the application of a force to said leaf spring structure, and including an output sensor means responsive to the displacement of at least one of said leg portions for deriving an output which is a function of the force applied to the transducer, the step of:

forming said leaf spring structure of a monocrystalline material.

2. The method of claim 1 wherein said leg portions of said monocrystalline leaf spring structure are separated by a slot in said monocrystalline material, and including the step of orienting the longitudinal axis of said slot parallel to a crystallographic axis of said monocrystalline material.

3. The method of claim 1 wherein said monocrystalline material is nonmetallic.

4. The method of claim 1 wherein said monocrystalline material is a semiconductive material.

5. The method of claim 1 including, forming a sensing mass structure on said spring structure.

6. The method of claim 5 wherein said step of forming said sensing mass on said spring structure includes, forming said sensing mass structure with approximately equal mass on opposite sides of the plane of the wide dimension of said leaf spring structure.

7. The method of claim 2 wherein said monocrystalline material is of the diamond cubic type and wherein the longitudinal axis of said slot is oriented parallel to one of the $<01\bar{1}>$ and $<0\bar{1}\bar{1}>$ crystallographic axes of said monocrystalline material.

8. The method of claim 2 wherein said step of forming said spring structure of said monocrystalline material includes, etching said spring structure from a wafer of said monocrystalline material.

9. The method of claim 8 wherein said step of etching includes, etching said spring structure with an anisotropic etchant for the monocrystalline material so that said slot is preferentially etched along a predetermined crystallographic plane.

10. The method of claim 9 wherein the monocrystalline material is silicon.

11. The method of claim 10 including the step of, forming piezoresistive elements in said spring structure.

12. The method of claim 8 including the step of, etching a base support structure from said wafer of monocrystalline material, said base support structure being connected to said etched spring structure by an unetched portion of said wafer for supporting said spring structure therefrom.

13. The method of claim 8 wherein said wafer is of diamond cubic crystal type and wherein said wafer has a major face thereof in the $<110>$ crystallographic plane and wherein the wide dimension of said leaf spring is in the $<110>$ crystallographic plane.

14. The method of claim 8 wherein the step of etching includes, etching an array of said spring structures simultaneously from a single wafer.

15. The method of claim 12 wherein the step of etching said base support structure includes, etching said spring structure so as to leave said base support structure outside of the periphery of said spring structure.

16. The method of claim 12 including the step of mounting said base support structure to the face of a support plate.

17. The method of claim 13 wherein the spring structure includes a pair of mutually opposed E-shaped folded cantilever leaf spring portions having a plurality of intersecting elongated rectilinear slots defining said spring structure, and wherein some of said slots have their longitudinal axes oriented parallel to the $<01\bar{1}>$ crystallographic axis and other ones of said slots have their longitudinal axes oriented parallel to the $<011>$ crystallographic axis.

18. In a method for fabricating a solid state force transducer, the steps of:

forming a leaf spring structure in a wafer by recessing the leaf spring pattern at a selected location through a first major face of said wafer; and recessing a second recess at a selected location in registration with said first recessed pattern, through the opposite major face of said wafer and intersecting said second recess with said first recessed pattern to define said leaf spring structure.

19. In a method for fabricating a solid state force transducer, the steps of:

forming a leaf spring structure in a wafer by recessing a leaf spring pattern at a selected location through a first major face of said wafer;

said recessed leaf spring pattern including a pair of mutually opposed E-shaped leaf spring pattern portions, each E-shaped spring pattern portion including a deflectable central leg portion extending outwardly from a central region of the spring structure and a pair of leg portions on opposite sides of and extending outwardly from said central region generally parallel to said central leg portion, said outer leg portions being supported at their inner ends from a portion of the wafer and being interconnected at their outer ends to the outer end of said central leg portion for deflection therewith.

20. The method of claim 19 wherein said step of recessing said spring structure from a wafer of said monocrystalline material includes etching said spring structure from said wafer so as to leave an unetched web portion spanning the space between adjacent leg portions of said spring structure, said web portion being substantially thinner than said leg portions being spanned by said web.

21. In a solid state force transducer:

leaf spring means having a plurality of leg portions angularly separated about an axis of maximum compliance and supported so that said leg portions of said leaf spring means are physically displaced relative to the support structure in response to the application of a force to said leaf spring means;

output sensor means disposed relative to said leaf spring means so as to be responsive to the displacement of at least one of said leg portions in the direction of maximum compliance for deriving an output which is a function of the force applied to the transducer; and wherein said leaf spring means is of a monocrystalline material.

22. The apparatus of claim 21 wherein said leg portions of said monocrystalline leaf spring means are separated by a slot in said monocrystalline material, and wherein the longitudinal axis of said slot is oriented parallel to a crystallographic axis of said monocrystalline material.

23. The apparatus of claim 21 wherein said monocrystalline material is nonmetallic.

24. The apparatus of claim 21 wherein said monocrystalline material is a semiconductive material.

25. The apparatus of claim 21 including sensing mass means formed on said leaf spring means.

26. The apparatus of claim 25 wherein said sensing mass means is disposed with approximately equal mass on opposite sides of the plane of the wide dimension of said leaf spring means.

27. The apparatus of claim 22 wherein said monocrystalline material is of the diamond cubic type and wherein the longitudinal axis of said slot is oriented parallel to one of the $<01\bar{1}>$ and $<0\bar{1}\bar{1}>$ crystallographic axes of said monocrystalline material.

28. The apparatus of claim 21 wherein said output sensor means includes piezoresistive means formed in said spring structure.

29. The apparatus of claim 21 including base support structure disposed outside of the periphery of said spring structure for supporting said spring structure therefrom.

30. The apparatus of claim 27 wherein said spring structure includes a pair of mutually opposed E-shaped folded catilever leaf spring portions having a plurality of intersecting elongated rectilinear slots defining said spring structure, and wherein some of said slots have their longitudinal axes oriented parallel to the $<01\bar{1}>$ crystallographic axis and other ones of said slots have their longitudinal axes oriented parallel to the $<0\bar{1}\bar{1}>$ crystallographic axis.

31. The product of the method of claim 8.
32. The product of the method of claim 9.
33. The product of the method of claim 12.
34. The product of the method of claim 14.
35. The product of the method of claim 19.
36. The product of the method of claim 18.
37. The product of the method of claim 20.

* * * * *